(12) United States Patent
Colburn et al.

(10) Patent No.: US 7,883,832 B2
(45) Date of Patent: Feb. 8, 2011

(54) METHOD AND APPARATUS FOR DIRECT REFERENCING OF TOP SURFACE OF WORKPIECE DURING IMPRINT LITHOGRAPHY

(75) Inventors: Matthew E. Colburn, Hopewell Junction, NY (US); Yves C. Martin, Ossining, NY (US); Theodore G. van Kessel, Millbrook, NY (US); Hematha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1156 days.

(21) Appl. No.: 11/028,798

(22) Filed: Jan. 4, 2005

(65) Prior Publication Data

US 2006/0145400 A1 Jul. 6, 2006

(51) Int. Cl.
*G03F 7/26* (2006.01)
*H02N 1/04* (2006.01)

(52) U.S. Cl. ...................................... 430/302; 310/311
(58) Field of Classification Search ................. 430/322, 430/302; 384/123; 269/21, 75; 355/74, 355/76; 356/399, 401; 310/311
See application file for complete search history.

(56) References Cited

U.S. PATENT DOCUMENTS 3,969,004 A * 7/1976 Schliemann ................ 384/123
6,825,915 B2 * 11/2004 Yamauchi et al. ............. 355/72

\* cited by examiner

*Primary Examiner*—Thorl Chea
(74) *Attorney, Agent, or Firm*—McGinn IP Law Group, PLLC

(57) ABSTRACT

An apparatus (and method) for referencing a surface of a workpiece during imprint lithography, includes an air bearing for mechanically referencing a surface of the workpiece, and a lithographic template coupled to the air bearing.

10 Claims, 4 Drawing Sheets

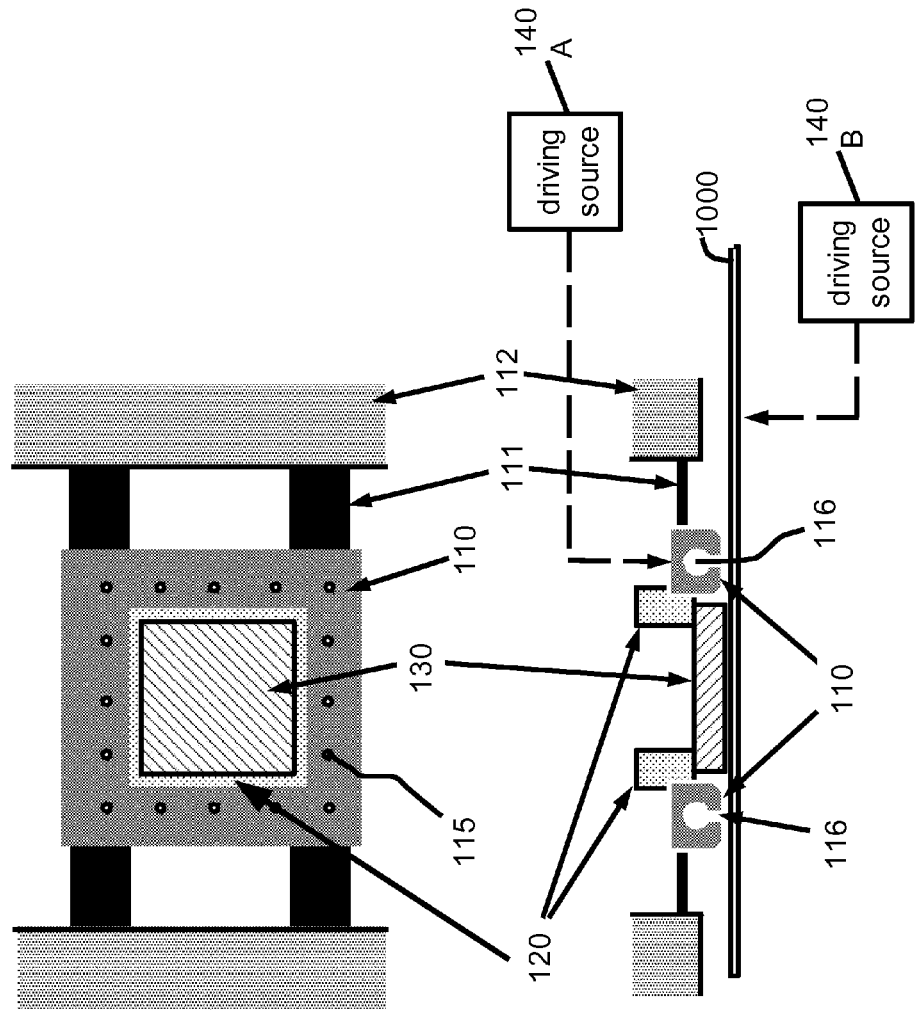

200

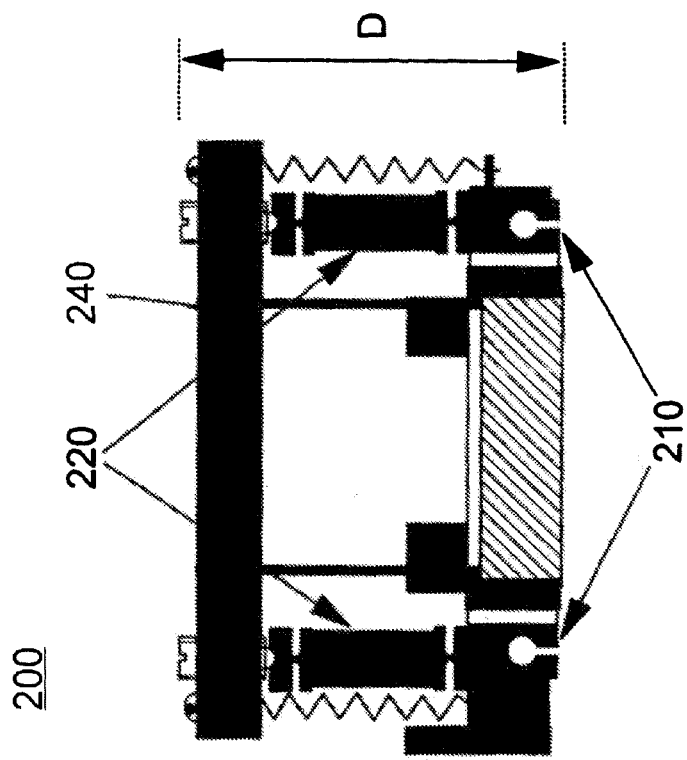

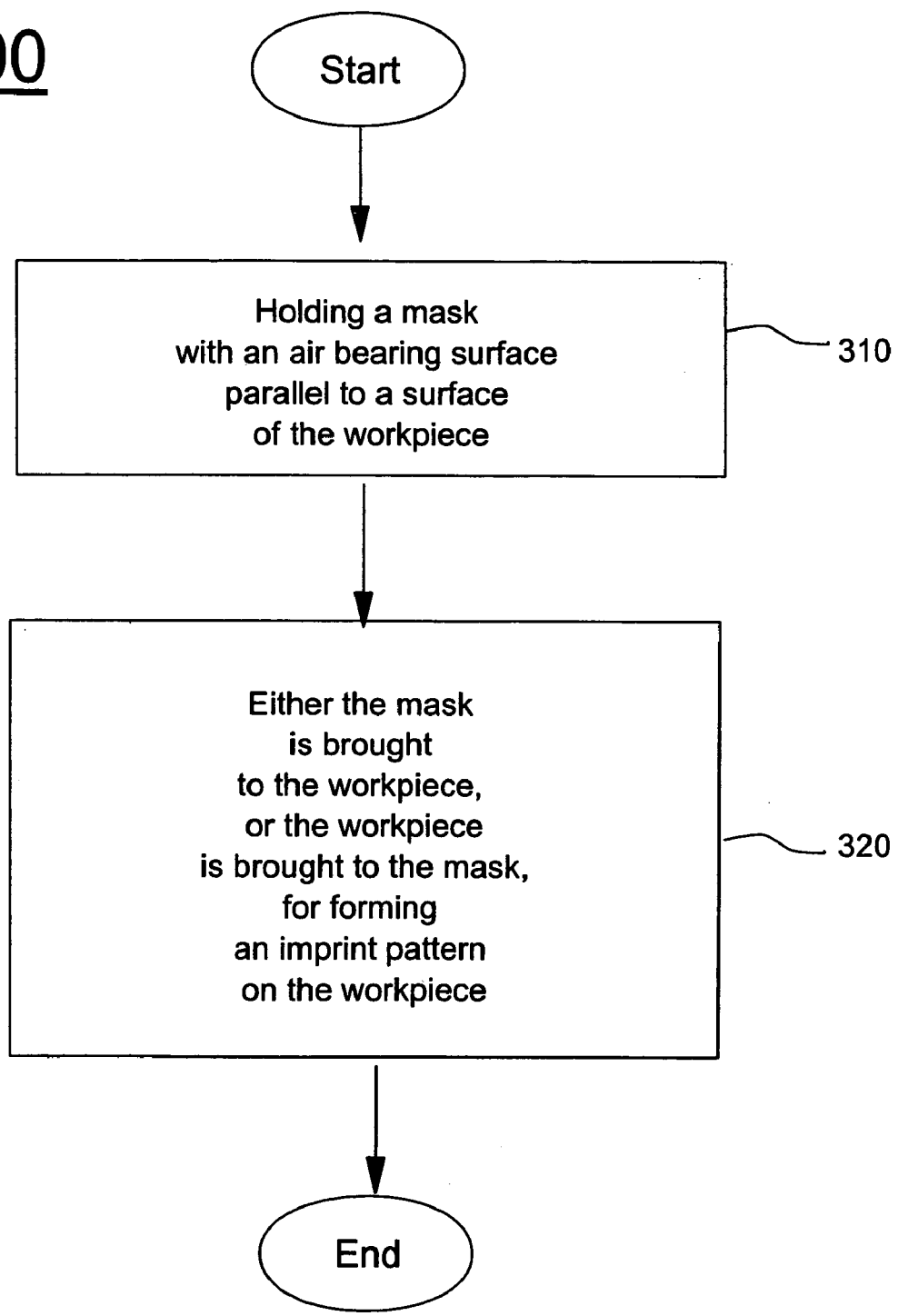

METHOD AND APPARATUS FOR DIRECT REFERENCING OF TOP SURFACE OF WORKPIECE DURING IMPRINT LITHOGRAPHY

BACKGROUND OF THE INVENTION

1. Field of the Invention

The present invention generally relates to a lithography apparatus and method, and more particularly to a method and apparatus for direct mechanical referencing of a surface (e.g., a top surface) of a workpiece during in nano-imprint lithography.

2. Description of the Related Art

Conventional imprint lithographic methods rely on extremely precise translation stages and fixtures to locate a workpiece or substrate under the imprint template (e.g., mold or mask) such that the template is exactly parallel to the workpiece. Typically, in nano-imprint techniques, a rigid quartz template (also referred to as a mask or mold) is employed in which features have been etched. A liquid photoresist is deposited on a workpiece (e.g., usually a semiconductor wafer), and the quartz mask is pressed against the liquid resist, which fills the cavities in the mask and spreads out between the mold and the wafer. The photoresist is then exposed to ultraviolet (UV) radiation causing it to polymerize, and the mask is pulled off. What is left on the polymerized resist-coated surface of the workpiece are the inverted topographical features of the mask.

In order to achieve practical results, several precision steps must be performed. First, the mask must be precisely positioned over and parallel to the resist-coated workpiece. The mask is then lowered and laterally aligned to the features on the workpiece while maintaining precise parallelism. As this is performed, appropriate normal and lateral steering forces are applied as the photoresist spreads out under the mask such that the resist spreads out evenly. Precise optical alignment of features on the mask relative to those on the workpiece is performed as this process occurs. Finally, when the resist has been sufficiently spread out and aligned, the resist is exposed and polymerized using ultraviolet light and the mask is removed.

Thus, in order to achieve the strict precision required, conventional positioning stages are employed. These conventional stages are large, expensive and slow. Thus, efficiency, costs and throughput are compromised.

Hence, prior to the present invention, there has been no method or system for rapidly and precisely registering the workpiece in the Z-dimension relative to the imprint mold. Moreover, the conventional systems and method have not achieved a precise parallelism between mask and workpiece using an air bearing design.

SUMMARY OF THE INVENTION

In view of the foregoing and other exemplary problems, drawbacks, and disadvantages of the conventional methods and structures, an exemplary feature of the present invention is to provide a structure (and method) for rapidly and precisely registering a workpiece in a predetermined dimension (e.g., the Z-dimension) relative to the imprint mold.

Another exemplary feature of the present invention is to provide a structure (and method) for achieving a precise mask-to-workpiece parallelism using an air bearing design.

In a first exemplary aspect of the present invention, an apparatus (and method) for referencing a surface of a workpiece during imprint-lithography, includes an air bearing for mechanically referencing a surface of the workpiece, and a lithographic template (e.g., preferably via a piezoelectric-actuated ministage) coupled to the air bearing.

With the unique and unobvious aspects of the invention, precise mask parallelism is achieved using an air bearing design to mechanically reference the workpiece (e.g., wafer) surface. An exemplary rectangular/square air bearing containing the imprint mask fixed to the bearing using a lithographic template (e.g., piezoelectric-actuated ministage) allows rapid approaching and stopping at a precise distance from the wafer surface. It also allows very fine motion of the mask with a precision on the order of about one nanometer. This fine motion is required to precisely position the mask over a chosen target on the wafer.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1A illustrates a bottom view 100 of an air bearing surface (ABS) 110;

FIG. 1B illustrates a side view of the air bearing surface (ABS) 110;

FIG. 2B illustrates a side view of the print head 200 including the air bearing surface 210 and other piezoelectric elements 220; and FIG. 3 illustrates a flowchart of a method 300 according to the present invention.

DETAILED DESCRIPTION OF EXEMPLARY EMBODIMENTS OF THE INVENTION

Figure 2A:
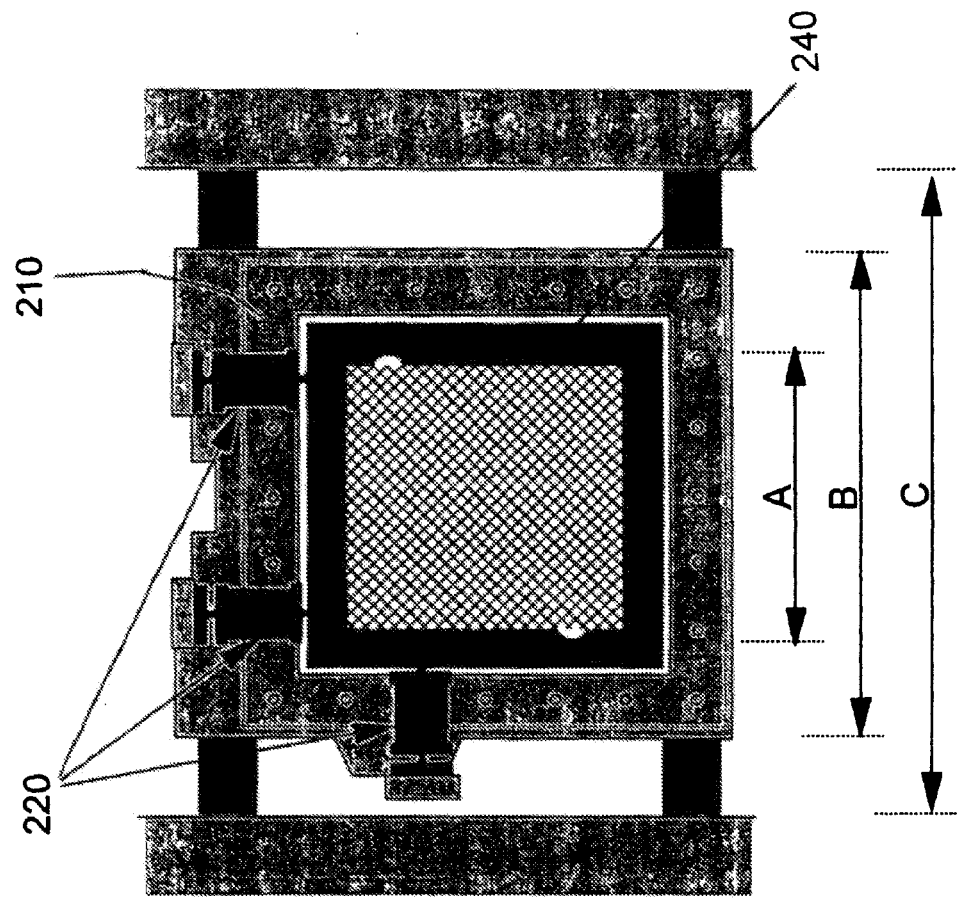
FIG. 2A illustrates a top view of a print head 200 showing piezoelectric motion elements 220 and an air bearing surface 210 below the head 200.

Referring now to the drawings, and more particularly to FIGS. 1A-3, there are shown exemplary embodiments of the method and structures according to the present invention.

Generally, in this invention, a mechanism is provided for bringing the mask in proximity to the wafer surface in a very precise, controllable way. This invention can be clearly distinguished from the conventional structures by virtue of the following.

That is, most steppers can be analogized to a very large "C-clamp" which holds a first structure (e.g., usually a mask) over a second structure which holds the wafer. This is a very large mechanical apparatus, and difficult to move and to true-up. In contrast to optical lithography in which no contact with the wafer occurs, in imprint lithography, the wafer is in fact touched. Indeed, a mask is pushed aggressively into the wafer to "imprint" the pattern thereon.

Thus, the invention approaches the problem from the standpoint that it recognizes that contact will occur (e.g., it purposely uses this aspect of "imprint" lithography), and thus uses some structure to mechanically reference the surface, so that there will be no need to stabilize the large C-clamp. This overcomes the challenges of mechanical stability and positioning associated with the conventional C-clamp, and indeed becomes much easier.

As discussed in further detail below and in reference to the drawings, the invention uses an air bearing in the inventive structure.

Exemplary Embodiment

As mentioned above, the process of imprint lithography involves the placement of a template or mold or mask (e.g., typically made of ultra-flat quartz, or glass, or the like) in proximity to the workpiece (typically a silicon wafer in semiconductor applications). The mold is precisely aligned to be parallel to the workpiece, and is then lowered onto the resist-coated workpiece.

Once positioned, ultraviolet (UV) light is projected through the quartz mold to expose and polymerize the photoresist. The mold is then removed leaving behind the desired imprinted pattern in the photoresist. It is essential that the template be precisely parallel to the workpiece during this process to allow the liquid resist to flow properly.

As mentioned, the present invention achieves this objective by employing an air bearing system (ABS) coupled to a lithographic template, for example, 6-axis piezoelectric ministage.

FIG. 1A illustrates a configuration of an apparatus 100 according to the present invention. The inventive apparatus 100 includes an air bearing surface 110 and a lithographic template 120 (e.g., a piezoelectric-actuated ministage or flexure) for an imprint mold (mask) 130 with movement capability in six (6) dimensions including X, Y, Z, θ, α, and β (rotation, pitch and roll).

The air bearing 110 can be formed of a flat metal plate or the like, and includes a plurality of holes 115 formed therein, as shown in FIG. 1A, for forcing air (or gas such as nitrogen, etc.) therethrough. In the example shown, a center square portion of the plate is cut-out in order to provide space for the mask in the middle of the plate.

The metal plate may have a thickness within a range of about 1 millimeter to about 20 millimeters, and preferably has a thickness of about 10 millimeters. The holes can have a typical diameter within a range of about 0.1 to about 1 millimeter, and preferably have a diameter of about 0.5 millimeter.

Also shown are air bearing ports 116 in the side sectional view of FIG. 1B. The ports are conduits drilled in the metal plate (above), for supplying pressured air (or gas) to the holes 115. Also shown are flexible leaf-springs 111 that connect the air-bearing frame 110 to the outside frame 112. The leaf-springs allow limited motion of the air-bearing frame 110 in the Z-direction (e.g., up to about 1 millimeter typically) and in the α and β pitch and roll angles (e.g., up to about 2 degrees typically), relative to the surface of the workpiece 1000, but efficiently maintains its position in the X-Y directions and in the θ rotation.

The mask 130 is held within the rectangular/square cutout (frame) in the air bearing 110 by the piezoelectric-actuated ministage 120, so that the mask 130 can be accurately moved over a range of about a few micrometers only in the horizontal dimensions or in the vertical dimensions.

Thus, the parallelism of the mask 130, the X-Y-Z positions of the mask, and the tilt and rotations of the mask can be precisely controlled (e.g., within small amounts such as within a range of about ±2 micrometers for X-Y-Z positions, and about +/− 0.01 degree for tilt and rotations).

The air bearing 110 has several properties. First, if an air bearing is pressed against a surface, then the air bearing will very precisely stop at a stable point an exact distance from the surface, and will be flat and parallel to the surface each and every time. Thus, if the mask is positioned relative to the air bearing frame, then it will be possible to precisely position the mask at a height set by the user.

In order to obtain a good print, it is very important to keep the mask parallel to the wafer as it is moved downwardly over the target.

Thus, instead of attempting to true-up a large C-clamp (or trying to keep the C-clamp vibrationally stabilized, etc.) as in the conventional techniques, the invention merely moves (presses) a very small device (e.g., an air bearing relative to the conventional C-clamp) down to the wafer. By the nature of the air bearing, the device is guaranteed to stop parallel to the wafer. All that is required is small positioning of the mask relative to the frame.

The inventive apparatus can be run in one of two exemplary methods. In a first method, the apparatus is lowered by a driving source 140A to a workpiece (e.g., wafer) 1000. In a second method, the workpiece 1000 is raised to the apparatus 100 in a driving source 140B. In either case, the air bearing becomes loaded as the workpiece 1000 approaches the air bearing surface 110.

Once fully loaded to the design pressure, the bearing design assures that the clearance between the bearing 110 and the workpiece 1000 is precise. The invention may be applicable to a design spacing of about 10 micrometers (e.g., about 10 micrometers between bearing 110 and workpiece 1000).

Turning to FIGS. 2A-2B, a print head structure is shown. More specifically, FIG. 2A illustrates a top view of a print head 200 showing details of three exemplary piezoelectric elements 220 (e.g., these elements are part of the ministage 120 shown in FIGS. 1A-1B) and an air bearing surface 210 below it (e.g., the same as surface 110 shown in FIGS. 1A-1B). It is noted that the FIG. 2A is a top view, but the air bearing ports and surface boundaries are shown superimposed to depict their relative position. FIG. 2B illustrates a side view of the print head 200 including the air bearing surface 210 and three additional piezoelectric elements 220.

Regarding a size of the structure, in an exemplary embodiment, reference letter A showing a width of the mask may be 1.0" (inch), whereas reference letter B showing an outside with of the frame may be 1.6", and reference C representing an outside width of the entire structure may be 2.1".

The piezoelectric-actuated ministage 220 allows a template 240 to be positioned relative to the air bearing 210. The position of the template 240 is calibrated prior to use.

Once loaded, the piezoelectric-actuated ministage 220 is utilized to precisely move the template 240 the remaining distance to the workpiece 1000 under precise control via air bearing ports. It is noted that precise motion can be achieved by actuating the piezoelectric elements and by adjusting the air bearing pressure. FIG. 2B shows reference letter D which represents a height of the structure. In an exemplary embodiment, reference letter D may be 1.2".

The combination of these elements enables the precise, low-mass, low-cost and high-speed positioning of the template for imprint lithography. It is important to note that the time response of the air bearing stage is so rapid relative to the frame that holds it and the wafer, that it is possible to servo in real-time relative to the alignment targets. The low frequency vibrations characteristic of a properly designed frame can be actively damped and eliminated by this servo mechanism. Air bearing or direct contact between print head and top surface limits alignment requirements to fine adjustments of limited amplitude (e.g., on the order of a few microns), under piezo-control, for the imprint process. This results in stability and repeatability.

FIG. 3 illustrates a flowchart of a method 300 according to the present invention.

Specifically, a method 300 of forming an imprint pattern on a surface of a workpiece, includes a step 310 of holding a mask with an air bearing surface parallel to a surface of the workpiece.

Then in step 320, either the mask is brought to the workpiece, or the workpiece is brought to the mask, for forming an imprint pattern on the workpiece.

Turning now to some of the phases of performing an imprint, if one wants to align a feature (e.g., the invention exemplarily aligns to approximately 5 nm), then one must first get in rough proximity to the wafer. It is noted that most conventional stages will align to a micron approximately. However, because the invention recognizes that prints on a wafer are oftentimes offset by 10 or 20 microns, the invention allows for the possibility of performing a rough alignment, and then performing a precise alignment down to a few nanometers.

Thus, the invention must see both targets (e.g., the underlying target and the target on the mask).

To do this, the invention utilizes the air bearing 110. The structure (e.g., the air bearing 110 and mask 130) is brought down with the mask 130 retracted slightly, so that it touches nothing, but is held very parallel and in very close proximity (e.g., preferably about 5 microns) to the underlying workpiece. With the air bearing 110 on and with this gap which is assured, it is possible to view optically both targets, and a rough alignment can be performed (e.g., move the stages so that the targets are within about a micron of each other).

Then, because only a small mass item is in close proximity to the wafer, the relatively light assembly can be lifted again, and the resist can be applied, and the structure can be dropped back into position (e.g., in close proximity to the wafer). Then, the mask 130 can be lowered in a controllable manner and in a very parallel fashion to press the resist and make the imprint.

Hence, the air bearing 110 serves to first bring the mask 130 down so that it is parallel to the workpiece 1000, and then the piezoelectric elements 120 allow the invention to lower the mask 130 in a very controlled, parallel manner onto the workpiece 1000 to press the resist. Thus, the invention first performs a rough alignment, and then a second more precise alignment is performed during the actual imprinting step. It is noted that it is possible to do a global alignment step to determine the approximate positions of all sites on the wafer. In this case, the individual sites are located with adequate precision without the rough align step. There are many sequence variations possible. Those skilled in the art will recognize that the apparatus is flexible to accommodate the variations.

Hence, the invention ensures that the mask is parallel and at a known distance from the workpiece, with a very low mass, high-speed system. Again, while the conventional C-clamp could be used, as noted above, the C-clamp system is a very slow, very massive, and very expensive system. Thus, the invention reduces a very bulky, very heavy, and very complicated system to a very simple, light system.

Another benefit of using the air bearing system in the present invention is found at the end of the imprint process.

That is, once the resist is exposed (e.g., somewhat analogous to UV-curable cement), even though there is a release layer coating the mask 130, a certain amount of force is still required to pull the mask 130 from the wafer 1000. The air bearing 110 is useful for providing a local force to push the mask 130 away from the wafer 1000. This is very advantageous.

Further, because the air bearing 110 can be operated with nitrogen in an exemplary embodiment, the nitrogen can be used as an oxygen($O_2$)-purge mechanism. That is, the nitrogen will drive the oxygen away from the vicinity where the liquid resist that is being exposed.

Generally, oxygen causes the photo-reaction of the resist to be "poisoned". Thus, if there is a large amount of oxygen, a ring will be formed of uncured photoresist around the pattern. This is detrimental. However, the invention can use nitrogen to run the air bearing, and thereby can drive nitrogen into the immediate area of interest. Thus, the nitrogen purges the oxygen from the exposure area, thereby avoiding the ring of uncured photoresist.

Finally, the invention allows fine positioning without scraping the wafer. In other words, the invention can perform a coarse alignment in which the wafer can be moved under the air bearing. Since the air bearing 110 has no friction, the wafer 1000 can be moved back and forth while maintaining the mask 130 in close proximity to the wafer 1000.

Thus, with the unique and unobvious aspects of the invention, precise mask parallelism is achieved using an air bearing design to mechanically reference the wafer surface. The air bearing containing the imprint mask, which is fixed to the bearing using a piezoelectric-actuated ministage (e.g., a flexure), allows rapid approach and stopping at a precise distance from the wafer surface.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. An imprint lithography apparatus, comprising:
   an air bearing for mechanically referencing a surface of a workpiece having photoresist deposited thereon;
   a template provided within said air bearing; and
   a piezoelectric-actuated ministage holding said template within air bearing, said piezoelectric-actuated ministage coupled to said air bearing.

2. The apparatus of claim 1, wherein said piezoelectric-actuated ministage comprises one or more axes.

3. The apparatus of claim 1, wherein said template comprises an imprint mask.

4. The apparatus of claim 1, wherein said air bearing comprises a substantially flat metal plate including a plurality of holes formed therein to conduct a gas from a manifold, thereby forming said air bearing.

5. The apparatus of claim 1, further comprising a driving source for driving said air bearing to the workpiece.

6. The apparatus of claim 5, wherein the driving source comprises a nitrogen source for driving said air bearing.

7. The apparatus of claim 2, wherein said piezoelectric-actuated ministage maintains an imprint mask of said template in a parallel orientation to the surface of the workpiece.

8. The apparatus of claim 3, wherein the air bearing includes a cut-out formed therein, and
   wherein the imprint mask is held within the cut-out in the air bearing by said piezoelectric-actuated ministage, such that said imprint mask is held stably in a horizontal dimension and in a vertical dimension.

9. The apparatus of claim 1, further comprising a driving source for driving the workpiece to the air bearing.

10. The apparatus of claim 1, wherein said air bearing maintains a clearance between the air bearing and the workpiece.

* * * * *